(12) United States Patent
Ahlstedt

(10) Patent No.: US 9,590,147 B2
(45) Date of Patent: Mar. 7, 2017

(54) CONVERSION ELEMENT FOR LIGHT-EMITTING DIODES AND PRODUCTION METHOD

(75) Inventor: Mikael Ahlstedt, München (DE)

(73) Assignee: OSRAM Opto Semiconductors GmbH (DE)

( * ) Notice: Subject to any disclaimer, the term of this patent is extended or adjusted under 35 U.S.C. 154(b) by 533 days.

(21) Appl. No.: 14/115,917

(22) PCT Filed: May 3, 2012

(86) PCT No.: PCT/EP2012/058134
§ 371 (c)(1),
(2), (4) Date: Dec. 18, 2013

(87) PCT Pub. No.: WO2012/152652
PCT Pub. Date: Nov. 15, 2012

(65) Prior Publication Data
US 2014/0145231 A1    May 29, 2014

(30) Foreign Application Priority Data
May 6, 2011 (DE) .................. 10 2011 100 710

(51) Int. Cl.
*H01L 33/50* (2010.01)
*C03B 37/025* (2006.01)
*C03B 37/075* (2006.01)

(52) U.S. Cl.
CPC .......... *H01L 33/504* (2013.01); *C03B 37/025* (2013.01); *C03B 37/075* (2013.01); *C03B 2201/34* (2013.01); *C03B 2203/02* (2013.01); *C03B 2203/04* (2013.01); *H01L 33/505* (2013.01); *H01L 2224/48091* (2013.01)

(58) Field of Classification Search
CPC .... H01L 33/504; C03B 37/075; C03B 37/025
See application file for complete search history.

(56) References Cited

U.S. PATENT DOCUMENTS

| | | |
|---|---|---|
| 2005/0148110 A1 | 7/2005 | Ott et al. |
| 2007/0170418 A1 | 7/2007 | Bowers et al. |
| 2009/0103297 A1 | 4/2009 | Bogner et al. |

FOREIGN PATENT DOCUMENTS

| | | |
|---|---|---|
| CN | 101740707 | 6/2010 |
| CN | 102015961 | 4/2011 |
| DE | 36 34 001 A1 | 8/1987 |
| DE | 196 38 667 A1 | 4/1998 |
| DE | 10 2006 027 307 A1 | 12/2007 |
| DE | 10 2006 037 730 A1 | 2/2008 |
| DE | 10 2007 046 348 A1 | 4/2009 |
| DE | 10 2007 051 370 A1 | 4/2009 |
| DE | 10 2008 021 438 A1 | 12/2009 |

(Continued)

OTHER PUBLICATIONS

English translation of the Chinese Notification of the First Office Action dated Sep. 6, 2015 from corresponding Chinese Patent Application No. 201280022110.7.

(Continued)

*Primary Examiner* — Joseph L Williams
(74) *Attorney, Agent, or Firm* — DLA Piper LLP (US)

(57) ABSTRACT

A method of producing a conversion element includes forming a preform from a glass, reshaping the preform into a structured glass fiber using a structuring element, and dividing the glass fiber into conversion elements.

15 Claims, 2 Drawing Sheets

(56) References Cited

FOREIGN PATENT DOCUMENTS

| | | |
|---|---|---|
| DE | 10 2008 030 253 A1 | 12/2009 |
| DE | 10 2008 045 331 A1 | 3/2010 |
| DE | 10 2008 057 140 A1 | 5/2010 |
| DE | 10 2009 020 569 A1 | 11/2010 |
| DE | 10 2009 035 100 A1 | 2/2011 |
| EP | 1 441 395 A2 | 7/2004 |
| JP | 11-001326 | 1/1999 |
| JP | 2006-117857 | 5/2006 |
| JP | 2007-016171 A | 1/2007 |
| JP | 2007-031196 | 2/2007 |
| JP | 2007-039303 | 2/2007 |
| JP | 2007-103901 | 4/2007 |
| JP | 2010-129300 | 6/2010 |
| WO | 2009/052902 | 4/2009 |
| WO | 2010/006586 A1 | 1/2010 |

OTHER PUBLICATIONS

English translation of Japanese Notice of Reasons for Rejection dispatched Sep. 9, 2014 from corresponding Japanese Patent Application No. 2014-508801.

CONVERSION ELEMENT FOR LIGHT-EMITTING DIODES AND PRODUCTION METHOD

TECHNICAL FIELD

This disclosure relates to a conversion element for light-emitting diodes, in particular a luminescence conversion element, with which light-emitting diodes of individual colors can be produced, and an associated production method.

BACKGROUND

DE 19638667 C2 describes a semiconductor component which emits mixed-colored light. A luminescence conversion element has the effect that part of the emitted radiation having a wavelength of less than 520 nm is absorbed and emitted in a longer-wave range. The luminescence conversion element can at least partly consist of a transparent epoxy resin. It is provided with a fluorescent phosphor, for example, with $Y_3Al_5O_{12}:Ce^{3+}$, $Y_3Ga_5O_{12}:Ce^{3+}$, $Y(Al,Ga)_5O_{12}:Ce^{3+}$, $Y(Al,Ga)_5O_{12}:Tb^{3+}$, $Sc_3Al_5O_{12}:Ce^{3+}$, $Sc_3Ga_5O_{12}:Ce^{3+}$, $Sc(Al,Ga)_5O_{12}:Ce^{3+}$, $Sc(Al,Ga)_5O_{12}:Tb^{3+}$, $La_3Al_5O_{12}:Ce^{3+}$, $La_3Ga_5O_{12}:Ce^{3+}$, $La(Al,Ga)_5O_{12}:Ce^{3+}$, $La(Al,Ga)_5O_{12}:Tb^{3+}$, $SrS:Ce^{3+}$, $Na,SrS:Ce^{3+}$, $Cl,SrS:CeCl_3$, $CaS:Ce^{3+}$, $SrSe:Ce^{3+}$, $CaGa_2S_4:Ce^{3+}$, $SrGa_2S_4:Ce^{3+}$, $YAlO_3:Ce^{3+}$, $YGaO_3:Ce^{3+}$, $Y(Al,Ga)O_3:Ce^{3+}$, $ScAlO_3:Ce^{3+}$, $ScGaO_3:Ce^{3+}$, $Sc(Al,Ga)O_3:Ce^{3+}$, $LaAlO_3:Ce^{3+}$, $LaGaO_3:Ce^{3+}$, $La(Al,Ga)O_3:Ce^{3+}$, $Y_2SiO_5:Ce^{3+}$, $Sc_2SiO_5:Ce^{3+}$ or $La_2SiO_5:Ce^{3+}$.

A luminescence conversion element can also be formed from silicone. However, in that case, the problem occurs that heat generated by the light-emitting diode is dissipated only to an insufficient extent. Moreover, phosphors sensitive to moisture are suitable only to a limited extent for use in a semipermeable silicone membrane.

It could therefore be helpful to provide a novel conversion element for light-emitting diodes with use of photoluminescence and an associated production method.

SUMMARY

I provide a method of producing a conversion element including forming a preform from a glass, reshaping the preform into a structured glass fiber using a structuring element, and dividing the glass fiber into conversion elements.

I also provide a conversion element for a light-emitting diode, wherein the conversion element has photoluminescence, the conversion element includes a glass, the glass is luminescent and/or the glass of the conversion element is coated with a phosphor, and the glass of the conversion element has traces of a singulation process at at least one main surfaces of the conversion element.

I also provide a light-emitting diode including a light-emitting diode chip, and a conversion element, wherein the conversion element has photoluminescence, the conversion element includes a glass and the glass is luminescent and/or the glass if coated with a phosphor, wherein the glass of the conversion element has traces of a singulation process at at least one main surface of the conversion element, the conversion element is arranged at a radiation exit surface of the light-emitting diode chip, the conversion element has a cutout, and a connection region at the radiation exit surface of the light-emitting diode chip is accessible through the cutout.

DETAILED DESCRIPTION

Figure 1:
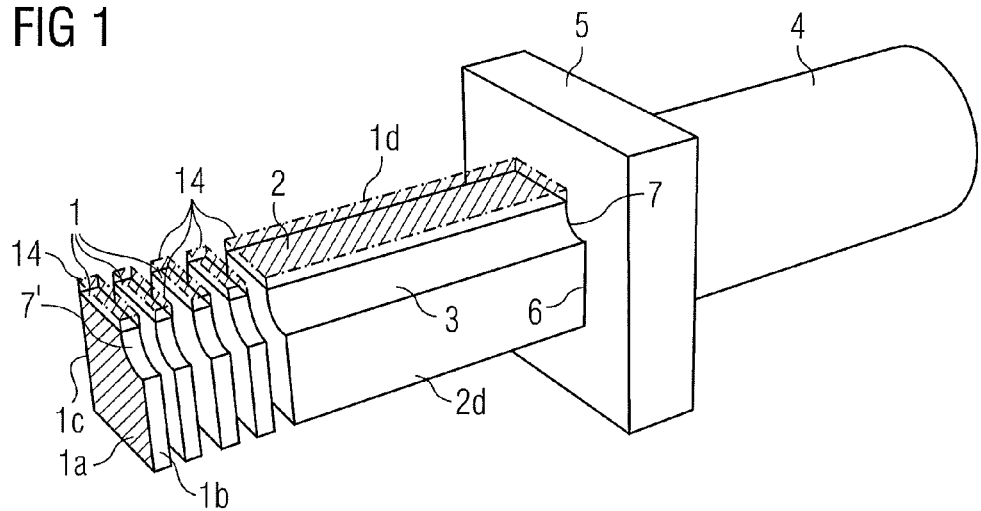
FIG. 1 shows a schematic illustration of the structuring of a glass fiber.

The conversion element is a glass, for example, and has photoluminescence brought about by virtue of the fact that the glass is luminescent or the conversion element is coated with a phosphor or the glass is luminescent and the conversion element is coated with a phosphor. In this case, a glass is understood to mean an arbitrary vitreous material that can be brought to a suitably structured form by methods of producing glass fibers. The photoluminescence can be fluorescence, in particular, that is to say a very short persistence of typically less than a duration of one millionth of a second as a direct consequence of and phenomenon accompanying an excitation of the phosphor by the photons of an incident electromagnetic radiation.

In examples in which the glass itself is luminescent, the photoluminescence can be brought about by virtue of the fact that a phosphor or a dopant is present in the glass. The phosphor can be formed by luminescent particles, for example, which are distributed in the glass. By way of example, ions of one or more rare earth metals are suitable as a dopant. The rare earth metals are scandium, yttrium, lanthanum, cerium, praseodymium, neodymium, promethium, samarium, europium, gadolinium, terbium, dysprosium, holmium, erbium, thulium, ytterbium and lutetium.

In further examples, the conversion element is a glass from the group of soda-lime glass, borosilicate glass, lead crystal glass and tellurium dioxide glass. A tellurium dioxide glass can contain tungsten trioxide, in particular.

It is possible for the glass of the conversion element to have traces of a singulation process at at least one of its main surfaces.

The traces can be, for example, sawing grooves, grinding traces, melted portions or the like. In this case, the singulation of the glass to form the conversion element took place along the main surfaces running perpendicularly to side surfaces of the conversion element. The traces of the singulation process can form roughenings that facilitate passage of electromagnetic radiation through the conversion element since they reduce a probability of total reflection at the main surfaces.

In the production method, a preform is formed from a glass, the preform is reshaped into a structured glass fiber using a structuring element, and the glass fiber is divided into conversion elements.

In one example of the method, the preform is formed from a luminescent glass in which a phosphor or a dopant is present.

In a further example of the method, the preform is formed from a glass from the group of soda-lime glass, borosilicate glass, lead crystal glass and tellurium dioxide glass.

In a further example of the method, the glass is doped with ions of one or more elements from the group of scandium, yttrium, lanthanum, cerium, praseodymium, neodymium, promethium, samarium, europium, gadolinium, terbium, dysprosium, holmium, erbium, thulium, ytterbium and lutetium, for example, with $Nd^{3+}$, $Er^{3+}$ or $Ce^{3+}$.

In a still further example of the method, the conversion element is coated with a phosphor.

The glass fiber may be coated with a reflective material and/or an absorbent material and/or a phosphor in at least one layer at at least one side surface of the glass fiber before being divided into individual conversion elements.

In this case, the side surface is an outer surface of the glass fiber running transversely, for example, perpendicularly, with respect to the main surfaces of the glass fiber. By way of example, the side surfaces or the side surface of the glass fiber connect(s) the main surfaces of the glass fiber to one another.

The material applied to the side surface in at least one layer is a reflective material, for example. The reflective material can be a metallic material. Furthermore, the reflective material can be light-scattering and/or light-reflecting particles introduced into a matrix material. By way of example, the reflective material can comprise as matrix material a silicone into which titanium dioxide particles are introduced. The reflective material then appears white, for example, to the observer.

The absorbent material can be, for example, a matrix material blackened by carbon black, for example, silicone blackened by carbon black.

Furthermore, it is possible for the conversion element to have a layer comprising a phosphor at at least one side surface. The phosphor can be the same phosphor as or a different phosphor than that present in the glass fiber or at the main surfaces of the glass fiber. By way of example, with the method it is possible for the conversion element to comprise a glass main body coated with a phosphor on all sides.

With the method it is advantageously possible that the at least one layer can be applied to the side surfaces of the structured glass fiber prior to division. In this way, the coating can be effected over a large area and thus technically relatively easily and efficiently. The layer is then divided in the same singulation step as the glass fiber and can therefore likewise have traces of a singulation process.

During the division of the glass fiber into conversion elements it is possible for traces to arise as a result of the singulation process at the main surfaces of the glass of the conversion element along which the singulation takes place. The traces of the singulation process can be, for example, sawing grooves, melted portions or the like.

Advantageously, it is possible that, due to the singulation process, the main surfaces of the conversion element have a roughening on account of the traces of the singulation process. This roughening can promote passage of radiation through the conversion element since the probability of total reflection at the main surfaces is reduced on account of the roughenings.

The structuring element may have at least one shaped portion. By way of example, the structuring element can have an opening through which the glass fiber is pulled in the viscous state. The opening then has, for example, a basic shape on which the shaped portion is superimposed. By way of example, the opening can have a rectangular or square basic shape and the shaped portion is formed at a corner of the rectangle or square and projects into the square or rectangle. The shaped portion then produces a cutout in the conversion element. That is to say that the conversion element, which is square or rectangular in terms of its basic area, for example, then has a cutout at one of its corners.

The cutout is chosen in terms of size such that it is suitable and provided to lead through a contact means. By way of example, in the finished light-emitting diode, the cutout in the conversion element can be formed such that a connection region at the outer surface of a light-emitting diode chip on which the conversion element is arranged is exposed. A contact means, for example, a connecting wire or a connecting foil, via which the light-emitting diode chip is electrically connectable, can then be led through the cutout.

The conversion element may be produced by a method described here. In this case, the method is demonstrable, for example, by the traces of the singulation process or formation of a cutout in the conversion element. Consequently, all features described for the method are also disclosed for the conversion element, and vice versa.

I further provide a light-emitting diode. The light-emitting diode may comprise a light-emitting diode chip and a conversion element described herein. That is to say that all features described for the conversion element and the method of producing the conversion element are also disclosed for the light-emitting diode, and vice versa.

The conversion element is arranged at a radiation exit surface of the light-emitting diode chip. By way of example, the conversion element can be fixed to the radiation exit surface of the light-emitting diode chip by a radiation-transmissive adhesive. Furthermore, it is possible for the conversion element to be fixed to a housing body and arranged in a manner spaced apart from the light-emitting diode chip.

The conversion element may have a cutout through which a connection region at the radiation exit surface of the light-emitting diode chip is accessible. That is to say that the cutout of the conversion element may leave the connection region, for example, a bonding pad, of the light-emitting diode chip free at least in places. In this way, even if the conversion element is applied directly to the light-emitting diode chip, the connection region is still freely accessible.

A contact means may be led through the cutout, wherein the contact means mechanically and electrically connects to the connection region. The contact means is a connecting wire, for example, which can be fixed to the connection region by wire bonding. With the method described here it is possible particularly easily to produce a conversion element having a cutout provided to lead through the contact means. In this case, the cutout is already produced during production of the conversion element, and further post-processing of the conversion element to produce the cutout is therefore not necessary.

Examples of the conversion element and of the production method are described in greater detail below with reference to the accompanying figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size to enable better illustration and/or for the sake of better understanding.

In the production method, in accordance with the illustration in FIG. 1, first, a preform 4 is produced from glass, the preform then being brought to the envisaged form of a structured glass fiber 2 by a structuring element 5. The glass fiber can then be divided into the conversion elements 1 which can take place, for example, in a manner known per se by a blade (blade dicing), by DWC (diamond wire cutting) or by washer jet cutting.

In an example of a production method corresponding to a method employed in the production of glass fibers, the preform 4 is pulled in a viscous state through the opening 6 of the structuring element 5, which opening can have specific shaped portions 7, for example, and is brought to the desired form in this way. On account of production, the structured glass fiber 2 has a homogeneous cross section which, however, can assume a wide variety of forms and can be, for example, round, angular, in particular square, or provided with bars or flutes 3, in accordance with the form of the opening 6 of the structuring element 5.

FIG. 1 furthermore shows that side surfaces 2d of the structured glass fiber 2 can optionally be coated with a layer 14. In this case, the layer 14 can comprise radiation-reflecting, radiation-absorbing or radiation-converting material. In this case, it is possible, in particular, for all the side surfaces 2d to be provided with the layer 14. In this case, a coating can also be effected in the region of the bar 3 which later forms the cutout 7' of the finished conversion element 1. This results in a conversion element 1 having the layer 14, for example, at all side surfaces 1d.

Figure 2:
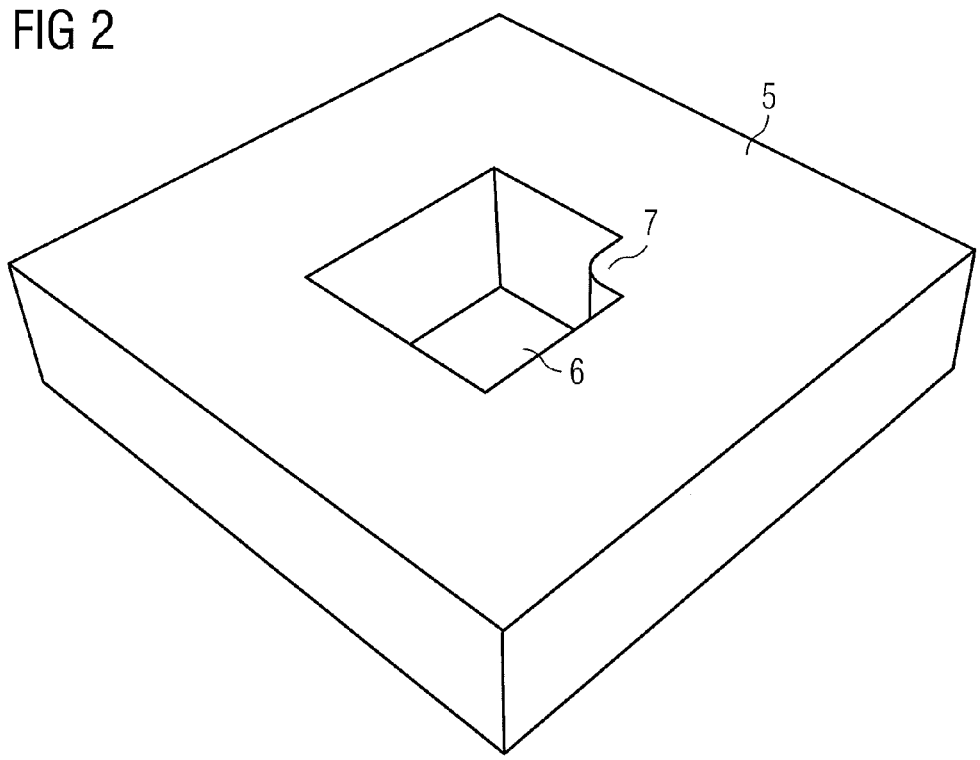
FIG. 2 shows an example of a structuring element.

FIG. 2 shows an example of a structuring element 5 having an opening 6 which is substantially square and has a shaped portion 7 in one corner. It can be discerned from this how the structured glass fiber 2 can be provided with different forms such that the conversion elements 1 can be adapted to different forms of the light-emitting diodes, electrical connection areas or housings. The structured glass fiber 2 can be produced by any desired method which is used to produce conventional glass fibers and by which a cross section suitable for the relevant application can be shaped.

One example of a borosilicate glass from which the conversion element can be produced by such a method is 81 $SiO_2$-13 $B_2O_3$-2 $Al_2O_3$-4 $Na_2O$. The numbers 81, 13, 2 and 4 preceding the compounds that form the glass in each case indicate the proportion of the relevant compound in mol %.

One example of a soda-lime glass (alkaline glass) from which the conversion element can be produced is 69 $SiO_2$-1 $B_2O_3$-3 $K_2O$-4 $Al_2O_3$-13 $Na_2O$-2 BaO-5 CaO-3 Mgo. The numbers 69, 1, 3, 4, 13, 2, 5 and 3 preceding the compounds which form the glass here, too, in each case indicate the proportion of the relevant compound in mol %.

One example of a tungsten-tellurium dioxide glass from which the conversion element can be produced is 71 $TeO_2$-22.5 $WO_3$-5 $Na_2O$-1.5 $Nb_2O_5$. The numbers 71, 22.5, 5 and 1.5 preceding the compounds which form the glass here, too, in each case indicate the proportion of the relevant compound in mol %.

The glasses indicated are merely individual examples from a large number of glasses suitable for the conversion element and the production method. A doping to produce the photoluminescence or the introduction of particles of a phosphor is preferably effected before the preform 4 is produced. Instead or in addition, a phosphor as coating can be applied to the conversion element. A subsequent coating is preferred particularly when the phosphor provided is not suitable for the production method, for example, due to the elevated temperature required to melt the glass.

The structured glass fiber 2 can additionally be provided on its outer side with a reflective layer, for example, composed of $TiO_2$, or with a layer structure that brings about interference, for example, with a dichroic mirror. The reflective property of the edges of the conversion element is thus improved.

Before being divided into the conversion elements, the structured glass fibers 2 can be stored in undivided form in a space-saving manner such that at any time an arbitrary number of conversion elements of the desired form can be provided quickly. In series production, high quality standards and narrow tolerance limits can be obtained by monitoring the quality of the glass fibers with comparatively low outlay. The use of glass improves the dissipation of the heat generated by the light-emitting diode and allows the unproblematic use of a large number of different phosphors.

Figure 3A:
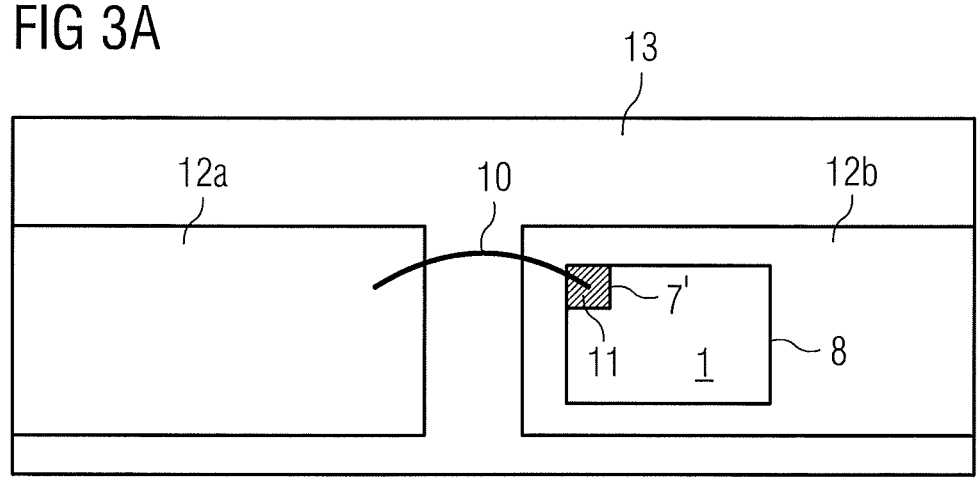
FIGS. 3A and 3B show schematic illustrations of a light-emitting diode.
Figure 3B:
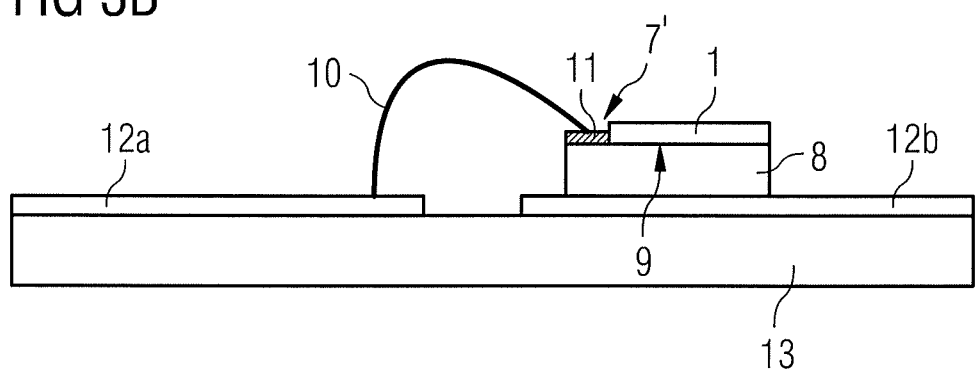

In conjunction with FIGS. 3A and 3B, a light-emitting diode described here is explained in greater detail on the basis of schematic illustrations.

FIG. 3A shows a light-emitting diode described here in a schematic plan view. The light-emitting diode comprises a carrier 13, which can be, for example, the part of a housing, a printed circuit board or a main body composed of an insulating material such as ceramic or semiconductor material. The light-emitting diode furthermore comprises connection locations 12a, 12b, to which a light-emitting diode chip 1 is electrically conductively connected.

In this case, the light-emitting diode chip 1 is applied to the connection location 12b. The light-emitting diode chip 1 has a radiation exit surface 9, downstream of which the conversion element 1 is directly disposed. The conversion element 1 has a cutout 7', at which a connection region 11, in the present case a bonding pad, at the radiation exit surface 9 is left free. As is evident in particular from the side view in FIG. 3B of the light-emitting diode, a contact means 10, in this case a contact wire, is led through the cutout 7', the contact wire being electrically conductively connected to the connection location 12a.

Overall, in this way electrical contact can be made with the light-emitting diode chip 8 in a particularly simple manner.

My conversion elements, LEDs and methods are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing a conversion element comprising:
   forming a preform from a glass,
   reshaping the preform into a structured glass fiber using a structuring element, and
   dividing the glass fiber into conversion elements.

2. The method according to claim 1, wherein the glass fiber is coated with a reflective material and/or an absorbent material and/or a phosphor in at least one layer at at least one side surface of the glass fiber before being divided into individual conversion elements such that the conversion elements have the layer at at least one of its side surfaces.

3. The method according to claim 1, wherein the structuring element has at least one shaped portion, and the at least one shaped portion produces a cutout of the conversion element, the cutout being provided to lead through a contact means.

4. The method according to claim 1, wherein the preform is formed from a luminescent glass in which a phosphor or a dopant is present.

5. The method according to claim 1, wherein the preform is formed from a glass selected from the group consisting of soda-lime glass, borosilicate glass, lead crystal glass and tellurium dioxide glass.

6. The method according to claim 1, wherein the glass is doped with ions of one or more elements selected from the group consisting of scandium, yttrium, lanthanum, cerium, praseodymium, neodymium, promethium, samarium, europium, gadolinium, terbium, dysprosium, holmium, erbium, thulium, ytterbium and lutetium.

7. The method according to claim 1, wherein the glass of the conversion element is coated with a phosphor.

8. A conversion element for a light-emitting diode, wherein
the conversion element has photoluminescence,
the conversion element comprises a glass,
the glass is luminescent and/or the glass of the conversion element is coated with a phosphor, and
the glass of the conversion element has traces of a singulation process at at least one main surface of the conversion element.

9. The conversion element according to claim 8, wherein the glass is luminescent and
a phosphor or a dopant is present in the glass.

10. The conversion element according to claim 8, wherein the conversion element is a glass selected from the group consisting of soda-lime glass, borosilicate glass, lead crystal glass and tellurium dioxide glass.

11. The conversion element according to claim 10, wherein the glass is a tellurium dioxide glass comprising tungsten trioxide.

12. The conversion element according to claim 8, wherein the glass is doped with ions of one or more elements selected from the group consisting of scandium, yttrium, lanthanum, cerium, praseodymium, neodymium, promethium, samarium, europium, gadolinium, terbium, dysprosium, holmium, erbium, thulium, ytterbium and lutetium.

13. A light-emitting diode comprising:
a light-emitting diode chip, and
a conversion element, wherein
the conversion element has photoluminescence,
the conversion element comprises a glass, and
the glass is luminescent and/or the glass is coated with a phosphor, wherein
the glass of the conversion element has traces of a singulation process at at least one main surface of the conversion element,
the conversion element is arranged at a radiation exit surface of the light-emitting diode chip,
the conversion element has a cutout, and
a connection region at the radiation exit surface of the light-emitting diode chip is accessible through the cutout.

14. The light-emitting diode according to claim 13, wherein a contact means is led through the cutout, and the contact means mechanically and electrically connects to the connection region.

15. The method of claim 1, wherein the structured glass fiber has a main extension direction and is divided vertical to the extension direction in a plurality of conversion elements such that the extent of a main face of each conversion element is much larger than a thickness of each conversion element.

* * * * *